(12) United States Patent
Oran et al.

(10) Patent No.: US 11,201,602 B1
(45) Date of Patent: Dec. 14, 2021

(54) APPARATUS AND METHODS FOR TUNABLE FILTERING

(71) Applicant: Analog Devices, Inc., Norwood, MA (US)

(72) Inventors: Ekrem Oran, Hollis, NH (US); Faith Kocer, Boxboro, MA (US); Santosh Kudtarkar, Ayer, MA (US); John Poelker, Andover, MA (US); Po-Hao Yeh, Arlington, MA (US); Christopher O'Neill, Chelmsford, MA (US); Christoph Steinbrecher, Pennington, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/948,411

(22) Filed: Sep. 17, 2020

(51) Int. Cl.
*H05K 7/00* (2006.01)
*H03H 11/04* (2006.01)
*H01L 25/18* (2006.01)
*H01L 23/66* (2006.01)
*H01L 23/552* (2006.01)
(Continued)

(52) U.S. Cl.
CPC .......... *H03H 11/04* (2013.01); *H01L 23/552* (2013.01); *H01L 23/66* (2013.01); *H01L 25/18* (2013.01); *H05K 1/144* (2013.01); *H05K 1/165* (2013.01); *H05K 1/181* (2013.01); *H01L 2223/6661* (2013.01); *H05K 2201/0715* (2013.01);
(Continued)

(58) Field of Classification Search
CPC . H01L 23/5386; H01L 23/66; H01L 23/5383; H01L 24/48; H01L 25/18; H01L 2224/48145; H01L 2224/48227
See application file for complete search history.

(56) References Cited

U.S. PATENT DOCUMENTS 5,227,746 A 7/1993 Esaki et al.
5,235,294 A 8/1993 Ishikawa et al.
(Continued)

FOREIGN PATENT DOCUMENTS

CN 1663122 A 8/2005
EP 0779707 B1 7/2002
(Continued)

OTHER PUBLICATIONS

Davis et al., "Integrated RF Architectures in Fully-Organic SOP Technology," IEEE Transactions on Advanced Packaging, vol. 25, No. 2, May 2002, in 7 pages.
(Continued)

*Primary Examiner* — Yuriy Semenenko
(74) *Attorney, Agent, or Firm* — Knobbe, Martens, Olson & Bear, LLP

(57) ABSTRACT

Apparatus and methods for tunable filtering are provided. In certain embodiments, a tunable filter is implemented using one or more controllable capacitors formed on a semiconductor die and using one or more shielded integrated inductors formed on a secondary circuit board that attaches to a carrier circuit board. Additionally, the shielded integrated inductors are formed from patterned metallization layers of the secondary circuit board, and shielding is provided on the secondary circuit board and/or the carrier circuit board to shield the inductors from the semiconductor die and/or other components.

20 Claims, 13 Drawing Sheets

(51) Int. Cl.
*H05K 1/16* (2006.01)
*H05K 1/14* (2006.01)
*H05K 1/18* (2006.01)

(52) U.S. Cl.
CPC ............... *H05K 2201/1003* (2013.01); *H05K 2201/1006* (2013.01)

(56) References Cited

U.S. PATENT DOCUMENTS

| | | | |
|---|---|---|---|
| 5,541,558 A | 7/1996 | Weber et al. | |
| 5,708,448 A | 1/1998 | Wallace | |
| 5,917,387 A | 6/1999 | Rice et al. | |
| 6,091,310 A | 7/2000 | Utsami et al. | |
| 6,160,571 A | 12/2000 | Wang | |
| 6,317,006 B1 | 11/2001 | Welland et al. | |
| 6,356,135 B1 | 3/2002 | Rastegar | |
| 6,399,997 B1 | 6/2002 | Lin et al. | |
| 6,418,030 B1 | 7/2002 | Yamaguchi et al. | |
| 6,784,766 B2 | 8/2004 | Allison et al. | |
| 6,815,739 B2* | 11/2004 | Huff | H01P 1/184 257/275 |
| 6,869,870 B2 | 3/2005 | Lin | |
| 6,872,962 B1* | 3/2005 | Barratt | H05K 1/165 257/1 |
| 7,127,217 B2 | 10/2006 | Tuttle et al. | |
| 7,259,643 B2 | 8/2007 | Son et al. | |
| 7,327,406 B2 | 2/2008 | Utsunomiya et al. | |
| 7,531,417 B2 | 5/2009 | Lin | |
| 7,592,250 B2 | 9/2009 | Shimada et al. | |
| 7,638,364 B2 | 12/2009 | Kwon et al. | |
| 7,843,702 B2 | 11/2010 | Choi et al. | |
| 8,089,155 B2 | 1/2012 | Lin | |
| 8,106,479 B1* | 1/2012 | Nathawad | H01L 23/5225 257/533 |
| 8,129,265 B2 | 3/2012 | Lin | |
| 8,134,425 B2 | 3/2012 | Rofougaran et al. | |
| 8,150,362 B2 | 4/2012 | Waight et al. | |
| 8,187,944 B2 | 5/2012 | Nathawad | |
| 8,400,307 B2 | 3/2013 | Kataya et al. | |
| 8,482,107 B2 | 7/2013 | Matsumoto et al. | |
| 8,810,331 B2 | 8/2014 | Gu et al. | |
| 8,918,070 B2 | 12/2014 | Shanan | |
| 8,971,218 B2 | 3/2015 | Shor et al. | |
| 8,987,061 B2 | 3/2015 | Lee et al. | |
| 9,024,700 B2 | 5/2015 | Ranta | |
| 9,166,564 B2 | 10/2015 | Koechlin | |
| 9,190,201 B2 | 11/2015 | Li et al. | |
| 9,219,512 B2 | 12/2015 | Khoini-Poorfard et al. | |
| 9,438,196 B2 | 9/2016 | Smith et al. | |
| 9,449,749 B2 | 9/2016 | Gupta et al. | |
| 9,484,879 B2 | 11/2016 | Scott et al. | |
| 9,543,892 B1* | 1/2017 | Farazian | H03B 5/1206 |
| 9,673,155 B2 | 6/2017 | Smith et al. | |
| 9,712,140 B1 | 7/2017 | Salvi et al. | |
| 9,735,752 B2 | 8/2017 | Mohsin et al. | |
| 9,755,029 B1 | 9/2017 | Goktepeli | |
| 9,906,318 B2 | 2/2018 | Zuo | |
| 9,907,114 B2 | 2/2018 | Sahota | |
| 9,990,089 B2 | 6/2018 | Dickinson | |
| 10,002,838 B2 | 6/2018 | Goktepeli | |
| 10,074,942 B2 | 9/2018 | Goktepeli | |
| 10,095,907 B2 | 10/2018 | Hinger | |
| 10,103,135 B2 | 10/2018 | Zuo et al. | |
| 10,236,573 B2* | 3/2019 | Cheng | H04B 1/0483 |
| 10,236,855 B2 | 3/2019 | Schmidhammer | |
| 10,254,901 B2 | 4/2019 | Dickinson et al. | |
| 10,382,031 B2 | 8/2019 | Ranta | |
| 10,431,558 B2 | 10/2019 | Goktepeli | |
| 10,432,152 B2 | 10/2019 | Watts et al. | |
| 10,446,898 B2* | 10/2019 | Cheng | H01P 1/2005 |
| 10,461,695 B2* | 10/2019 | Liu | H03B 5/1228 |
| 10,720,947 B1 | 7/2020 | Regadamilli et al. | |
| 2003/0222295 A1 | 12/2003 | Lin | |
| 2006/0194558 A1 | 8/2006 | Kelly | |
| 2007/0108551 A1 | 5/2007 | Lin | |
| 2007/0182521 A1 | 8/2007 | Lin | |
| 2007/0202684 A1 | 8/2007 | Lin | |
| 2007/0202685 A1 | 8/2007 | Lin | |
| 2009/0027141 A1 | 1/2009 | Oshimi | |
| 2009/0033439 A1* | 2/2009 | Igarashi | H03H 7/0115 333/185 |
| 2014/0264732 A1* | 9/2014 | Elsherbini | H01L 23/64 257/531 |
| 2016/0359466 A1 | 12/2016 | Schmidhammer | |
| 2017/0244376 A1* | 8/2017 | Morris | H03H 7/0115 |
| 2018/0090475 A1* | 3/2018 | Zuo | H01L 23/552 |
| 2020/0059217 A1 | 2/2020 | Masse et al. | |
| 2020/0279087 A1 | 9/2020 | Seo et al. | |

FOREIGN PATENT DOCUMENTS

| | | |
|---|---|---|
| JP | H10246775 A | 9/1998 |
| JP | 5041154 B2 | 10/2012 |
| KR | 101133144 B1 | 4/2012 |
| KR | 101296544 B1 | 8/2013 |
| WO | WO 2019/132925 A1 | 7/2019 |

OTHER PUBLICATIONS

New Edge Signal Solutions, SAX239R2—[30520]MHz Tunable Bandpass Filter dated Jul. 2020, in 5 pages.
Gee et al., "Highly-Selective Tunable Bandpass Filter With Two-Path Mixed Coupling" IEEE Microwave and Wireless Components Letters, vol. 24, No. 7 dated Jul. 2014, in 3 pages.
Mohieldin et al., "A 2.7-V 1.8-GHz Fourth-Order Tunable LC Bandpass Filter Based on Emulation of Magnetically Coupled Resonators" dated Jul. 2003, in 11 pages.
Streeter et al., "VHF High-Power Tunable RF Bandpass Filter Using Microelectromechanical MEM Microrelays" dated Mar. 30, 2001, in 15 pages.
Zahirovic "Tunable Filters and RF MEMS Variable Capacitors with Closed Loop Control" A thesis presented to the University of Waterloo in fulfillment of the thesis requirement for the degree of Doctor of Philosophy in Electrical and Computer Engineering dated 2011 in 153 pages.

* cited by examiner

US 11,201,602 B1

APPARATUS AND METHODS FOR TUNABLE FILTERING

FIELD OF THE DISCLOSURE

Embodiments of the invention relate to electronic systems, and more particularly, to tunable filters for radio frequency electronics.

BACKGROUND

Electronic systems can use tunable filters to adjust the frequencies filtered within a signal chain. Tunable filters can be used in a number of different applications, including, but not limited to, base stations, mobile devices, instrumentation, industrial electronics, military electronics, laptop computers, tablets, professional wideband digital radios, and compact and/or portable instruments. In contrast to fixed filters, tunable filters allow additional flexibility for a given application by providing control over the specific frequencies that are filtered.

SUMMARY OF THE DISCLOSURE

Apparatus and methods for tunable filtering are provided. In certain embodiments, a tunable filter is implemented using one or more controllable capacitors formed on a semiconductor die and using one or more shielded integrated inductors formed on a secondary circuit board that attaches to a carrier circuit board. Additionally, the shielded integrated inductors are formed from patterned metallization layers of the secondary circuit board, and shielding is provided on the secondary circuit board and/or the carrier circuit board to shield the inductors from the semiconductor die and/or other components. By implementing the tunable filter in this manner, a number of advantages are achieved, including high quality-factor (Q-factor), ultra-wideband performance, and/or an ability to be quickly tuned.

In one aspect, an radio frequency (RF) system with tunable filtering is provided The RF system includes a semiconductor die including a first controllable capacitor formed thereon. The RF system further includes a first circuit board configured to attach to a second circuit board. The first circuit board includes a first inductor structure formed therein from metallization of the first circuit board, and the first inductor structure is configured to resonate with the first controllable capacitor to provide a tunable filter. The first inductor structure is shielded from the semiconductor die by an inductor shielding structure formed at least in part from the metallization of the first circuit board.

In another aspect, a method of tunable filtering is provided. The method includes controlling a capacitance of a controllable capacitor formed on a semiconductor die, resonating the controllable capacitor with an inductor structure formed in a first circuit board from metallization of the first circuit board, wherein the first circuit board is attached to a second circuit board, and shielding the inductor structure from the semiconductor die using an inductor shielding structure formed at least in part from the metallization of the first circuit board.

In another aspect, a tunable filter is provided. The tunable filter includes a controllable capacitor formed on a semiconductor die, an inductor structure formed in a first circuit board from metallization of the first circuit board. The first circuit board is attached to a second circuit board, and the inductor structure resonates with the controllable capacitor. The tunable filter further includes an inductor shielding structure formed at least in part from the metallization of the first circuit board and enclosing the inductor structure.

DETAILED DESCRIPTION OF EMBODIMENTS

Figure 1A:
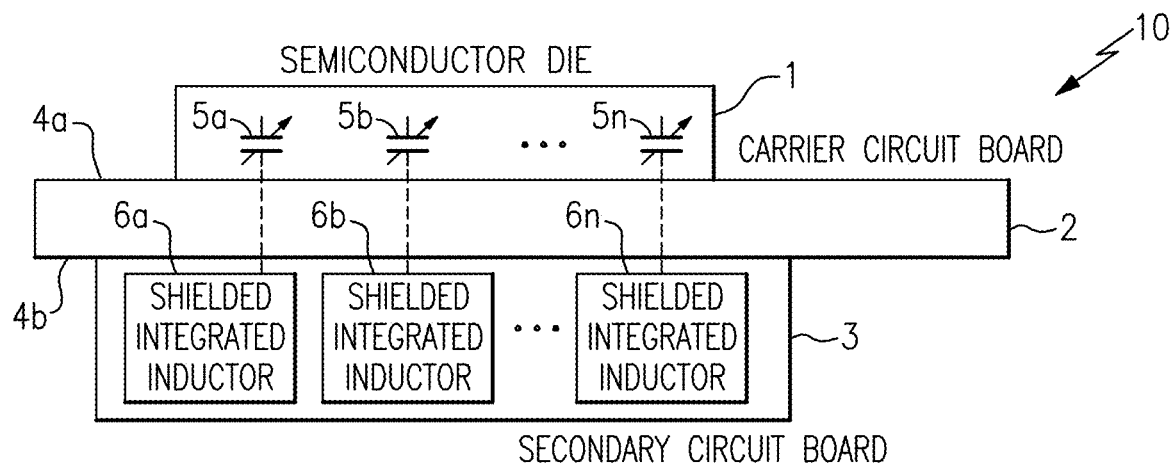
FIG. 1A is a schematic diagram of a tunable filter according to one embodiment.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Radio frequency (RF) filters can be used in a wide variety of applications for filtering the frequency content of RF signals. For example, in a wireless communication system, RF filters can be implemented with a bandpass frequency response to limit the frequency content of an RF signal to a particular frequency range or band. Such RF filters can be used in transmit and/or receive paths of the wireless communication system. To provide additional flexibility, it is desirable to implement RF filters to be tunable.

Provided herein are apparatus and methods for tunable filtering. In certain embodiments, a tunable filter is implemented using one or more controllable capacitors formed on a semiconductor die and using one or more shielded integrated inductors formed on a secondary circuit board that attaches to a carrier circuit board. Additionally, the shielded integrated inductors are formed from patterned metallization layers of the secondary circuit board, and shielding is provided on the secondary circuit board and/or the carrier circuit board to shield the inductors from the semiconductor die and/or other components.

By implementing the tunable filter in this manner, a number of advantages are achieved, including high quality-factor (Q-factor), ultra-wideband performance, and/or an ability to be quickly tuned. In contrast, tunable filters implemented using lumped inductors suffer from bulkiness, high cost, and/or component variations that necessitate adjustments and calibration.

In certain implementations, the semiconductor die is mounted to a first side of the carrier circuit board, while the secondary circuit board is mounted to a second side of the carrier circuit board opposite the first side. Thus, the controllable capacitors on the semiconductor die can connect to the secondary circuit board's inductors through the carrier circuit board. In other implementations, the semiconductor die is mounted to the secondary circuit board, which in turn is mounted to the carrier circuit board.

The shielded integrated inductors can be implemented in a variety of ways including, but not limited to, using multi-wound inductor structures and/or comb inductor structures. When multiple inductors are formed in the secondary circuit board, shielding can be provided between the inductors or shielding can be omitted between the inductors, for instance, to form cross-coupled filter structures and/or dual-mode filters.

The tunable filters herein can provide filtering to a RF signals of a variety of signal frequencies, including, but not limited to, signals in the very high frequency (VHF) range (30 megahertz (MHz) to 300 MHz) or ultra high frequency (UHF) range (300 MHz to 3 gigahertz (GHz)).

FIG. 1A is a schematic diagram of a tunable filter 10 according to one embodiment. The tunable filter 10 is implemented using a semiconductor die 1, a carrier circuit board 2, and a secondary circuit board 3, in this embodiment.

As shown in FIG. 1A, the semiconductor die 1 includes controllable capacitors 5a, 5b, . . . 5n. Although three controllable capacitors are depicted, the semiconductor die 1 can include more or fewer controllable capacitors. The semiconductor die 1 is attached to a first side 4a of the carrier circuit board 2. A semiconductor die, such as the semiconductor die 1 of FIG. 1A, is also referred to herein as an integrated circuit (IC).

In certain implementations, the carrier circuit board 2 is a multi-layer circuit board, such as a printed circuit board (PCB). Although not depicted in FIG. 1A, other components can be attached to the carrier circuit board 2, such as one or more other semiconductor dies, integrated passive devices (IPDs), or surface mount devices (SMDs). Such components can be attached to either or both sides of the carrier circuit board 2.

With continuing reference to FIG. 1A, the secondary circuit board 3 is attached to a second side 4b of the carrier circuit board 2 such that the secondary circuit board 3 and the semiconductor die 1 are on opposite sides of the carrier circuit board 2. The secondary circuit board 3 includes multiple conductive layers (for instance, copper metal layers separated from one another by dielectric) from which inductive structures are formed. In particular, the secondary circuit board 3 includes shielded integrated inductors 6a, 6b, . . . 6n formed from patterning the board's conductive layers. Although three shielded integrated inductors are depicted, more or fewer shielded integrated inductors can be included.

The shielded integrated inductors 6a, 6b, . . . 6n are shielded from the semiconductor die 1. Thus, electromagnetic interference from the inductors 6a, 6b, . . . 6n is blocked from reaching the semiconductor die 2. In certain implementations, a metal layer of a circuit board is used to form a ground plane that is interposed between the shielded integrated inductors 6a, 6b, . . . 6n and the semiconductor die 1, thereby allowing the semiconductor die to be directly over one or more inductors. Such a ground plane can be formed on a layer of the carrier circuit board 2 or on a layer (for instance, a top or outermost layer) of the secondary circuit board 3 that is between the inductors 6a, 6b, . . . 6n and the semiconductor die 1.

In certain implementations, the conductive layers of the secondary circuit board 3 are patterned to form a cage that surrounds the shielded integrated inductors 6a, 6b, . . . 6n. The cage can be grounded. Thus, the shielded integrated inductors 6a, 6b, . . . 6n can be surrounded on all sides by grounded metal, in some embodiments.

The controllable capacitors 5a, 5b, . . . 5n connect with the shielded integrated inductors 6a, 6b, . . . 6n to form inductor-capacitor (LC) resonators. Such LC resonators can be connected together to provide one or more tunable filters for filtering the signal content of RF signals. The LC resonators can be connected to form a wide variety of filtering circuits. Although shown as having a one-to-one correspondence between controllable capacitors and inductors, other implementations are possible. Thus, the number of controllable capacitors and inductors need not be the same.

The tunable filters can be controlled at least in part by changing the capacitance of the LC resonators. In one example, the controllable capacitors 5a, 5b, . . . 5n each include a bank of selectable capacitor cells, and data received from an interface of the semiconductor die 1 is used to select that capacitance values of the banks, thereby providing tuning. In a second example, the controllable capacitors 5a, 5b, . . . 5n each include a varactor with analog tuning. Although two examples of tuning are provided, the teachings herein are applicable to a wide variety of implementations of tuning. In certain implementations, the inductance of the LC resonators is also tunable, for instance, by changing a length of inductance using a switch and/or controlling a number of inductors in series or in parallel.

Figure 1B:
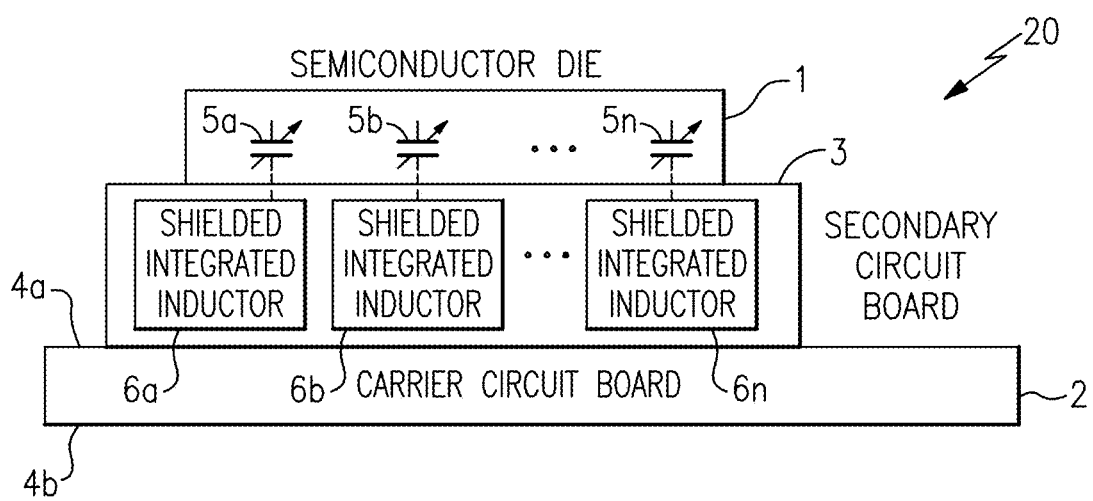
FIG. 1B is a schematic diagram of a tunable filter according to another embodiment.

FIG. 1B is a schematic diagram of a tunable filter 20 according to another embodiment. The tunable filter 20 of FIG. 1B is similar to the tunable filter 10 of FIG. 1A, except that in the tunable filter 20 the secondary circuit board 3 is interposed between the semiconductor die 1 and the carrier circuit board 2. In particular, the semiconductor die 1 is attached to a first side of the secondary circuit board 3, while a second side of the secondary circuit board 3 attaches to the first side 4a of the carrier circuit board 2.

To provide shielding between the shielded inductor structures 6a, 6b, . . . 6n and the semiconductor die 1, the secondary circuit board 3 can include a ground plane on a metal layer between the inductors 6a, 6b, . . . 6n and the semiconductor die 1. For example, a top or outermost conductive layer of the secondary circuit board 3 can be used to form such a ground plane. The secondary circuit board 3 can also include walls that form part of a grounded cage for shielding the inductors 6a, 6b, . . . 6n from the semiconductor die 1. A bottom ground plane can also be included on the secondary circuit board 3 or the carrier circuit board 2.

Figure 2A:
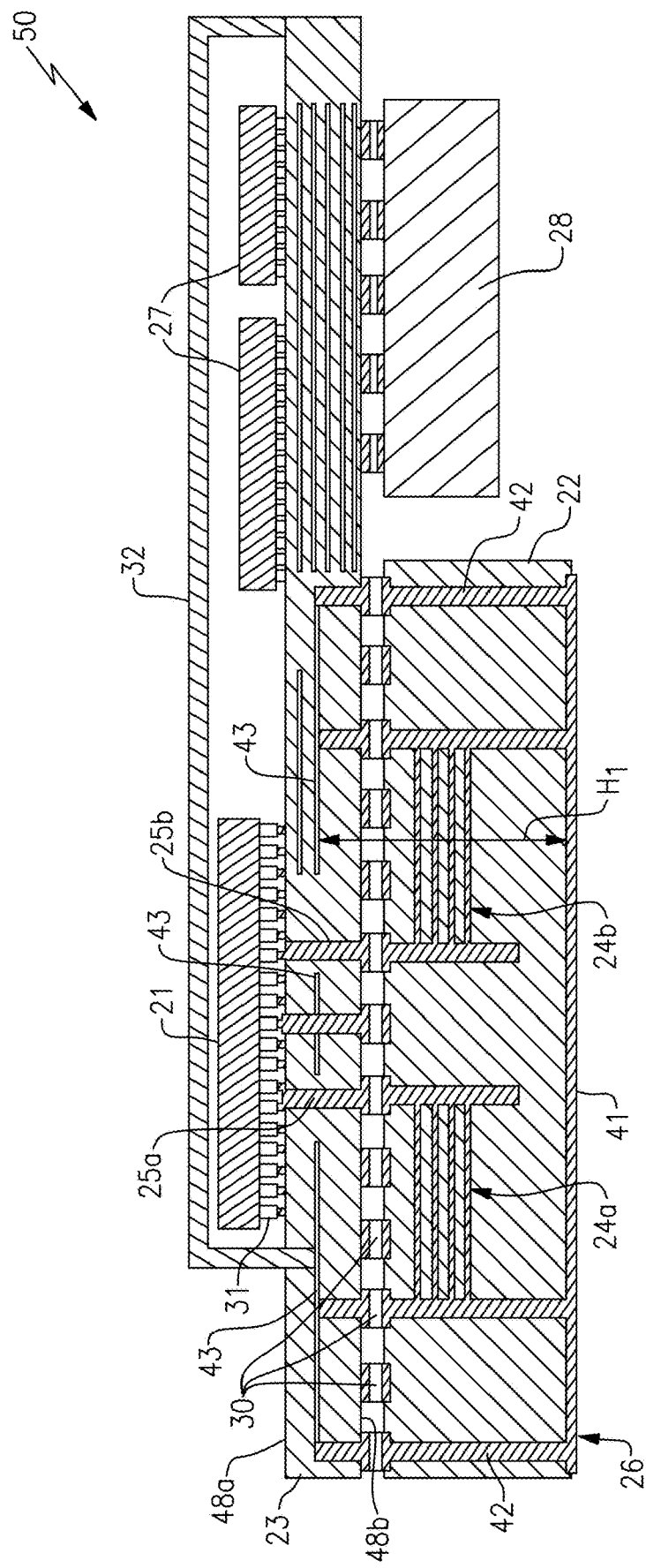
FIG. 2A is a schematic diagram of a cross-section of a radio frequency (RF) system according to one embodiment.

FIG. 2A is a schematic diagram of a cross-section of an RF system 50 according to one embodiment. The RF system 50 includes a semiconductor die 21 (including at least one controllable capacitor formed thereon), a secondary circuit board 22, a carrier circuit board 23, a first multi-wound inductor 24a, a second multi-wound inductor 24b, a first metal connection 25a, a second metal connection 25b, an inductor shielding structure 26, front side components 27, back side components 28, solder balls 30, copper pillars 31, and an RF shield 32.

In the illustrated embodiment, the secondary circuit board 22 includes two shielded inductor structures, corresponding to a first multi-wound inductor 24a and a second multi-wound inductor 24b, formed therein from conductive layers (for instance, patterned metallization layers separated by dielectric) of the secondary circuit board 22. Although two shielded inductor structures are depicted, the secondary circuit board 22 can be adapted to include more or fewer shielded inductor structures. Furthermore, although an example with multi-wound inductors are depicted, the secondary circuit board 22 can be implemented to include other types of inductors. Multi-wound inductors are also referred to herein as multi-turn inductors.

The secondary circuit board 22 can correspond to a wide variety of types of multi-layer circuit boards, such as PCBs. In certain implementations, the secondary circuit board 22 corresponds to a PCB with a single lamination step. Thus, the secondary circuit board 22 can be implemented with low cost processing to aid in achieving an overall RF system that is low cost and scalable.

In certain implementations, the PCB incudes at least three conductive layers. In certain implementations, the conductive layers are copper, such as thick copper for low resistance.

Using PCB technology to form the inductors 24a and 24b also provides the advantage of tight tolerance and controlled repeatability relative to lumped technology.

As shown in FIG. 2A, the semiconductor die 21 is attached to a first side 48a of the carrier circuit board 23. The semiconductor die 21 is connected in a flip-chip configuration using copper pillars 31, in this example. Using a flip-chip configuration with copper pillars 31 provides low inductance and low resistance to aid in achieving high quality-factor (Q-factor), wideband operation, and/or high frequency operation. Moreover, a flip-chip configuration can be associated with low radiation and parasitics. However, other implementations are possible, such as configurations using wire bonding.

In the illustrated embodiment, the secondary circuit board 22 is attached to a second side 48b of the carrier circuit board 23. In this example, solder balls 30 are used for providing connectivity between the secondary circuit board 22 and the carrier circuit board 23, for instance, using a ball grid array (BGA). However, other implementations are possible, such as a configuration using a land grid array (LGA).

Although not depicted in FIG. 2A for clarity of the figure, the semiconductor die 21 includes at least one controllable capacitor. Additionally, metal connections are provided through the carrier circuit board 23 to provide desired electrical connections between the controllable capacitors on the semiconductor die 21 and the shielded integrated inductors formed in the secondary circuit board 22.

For example, in the illustrated embodiment, a first metal connection 25a is provided for connecting a first end of the first multi-turn inductor 24a to a first pin (or to a first group of pins in parallel for reduced inductance) of the semiconductor die 21, while a second metal connection 25b is provided for connecting a first end of the second multi-turn inductor 24b to a second pin (or a second group of pins) of the semiconductor die 21.

In the illustrated embodiment, a second end of first multi-turn inductor 24a and a second end of the second multi-turn inductor 24b are connected to the inductor shielding structure 26, which is grounded. However, other implementations are possible, such as configurations in which metal connections through the carrier circuit board 23 are also included for connecting the second ends of the inductors 24a and 24b to corresponding pins (or groups of pins) of the semiconductor die 21.

The carrier circuit board 23 can also include input/output connections for the semiconductor die 21 and/or the secondary circuit board 22. In certain implementations, the carrier circuit board 23 is a customer circuit board, which can be modified for a particular application. Thus, the semiconductor die 21 and the secondary circuit board 22 can be deployed in a range of applications, and small modifications can be made to the customer circuit board for form and fit, to accommodate for a particular RF frequency range, and/or to keep RF operating frequencies confidential.

As shown in FIG. 2A, the inductor shielding structure 26 provides shielding between the inductors integrated in the secondary circuit board 22 and other components, including the semiconductor die 21. The inductor shielding structure 26 serves as grounded metal that surrounds the inductors 24a and 24b on all sides.

In illustrated embodiment, the inductor shielding structure 26 includes a bottom ground plane 41, grounded walls 42, and a top ground plane 43, which is interposed between the semiconductor die 21 and the inductors 24a and 24b. Openings are provided in the top ground plane 43 to allow passage of electrical connections between the semiconductor die 21 and the inductors 24a and 24b formed in the secondary circuit board 22.

However, other embodiments of inductor shielding structures are possible. In one example, grounded walls are included between the inductor 24a and the 24b running from the bottom ground plane 41 to the ground plane 43 through the BGA. Implementing the inductor shielding structure in this manner provides electrical isolation between the inductors. However, such grounded walls can be omitted or included in modified form to provide magnetically coupling between the inductors within the secondary circuit board 22.

The top ground plane 43 also serves to limit electromagnetic radiation from the semiconductor die 21 from reaching other components.

In the illustrated embodiment, the top ground plane 43 and a portion of the walls 42 are formed in the carrier circuit board 23, while the bottom ground plane 41 and another portion of the walls 42 are formed in the secondary circuit board 22. Thus, the resonant cavity in which the inductors reside is implemented across both the carrier circuit board 23 and the secondary circuit board 22. By implementing the inductor shielding structure 26 across the secondary circuit board 22 and the carrier circuit board 23, a smaller height $H_1$ of the resonant assembly is achieved relative to an implementation in which the shielding is entirely on the secondary circuit board 22.

In certain implementations, the inductor shielding structure 26 provides shielding for both electromagnetic interference (EMI) and electromagnetic compatibility (EMC).

In the illustrated embodiment, the inductor shielding structure 26 shields multiple inductors. Thus, a more compact area is achieved relative to large conventional coils using separate EMI/EMC shielding for each inductive coil.

As shown in FIG. 2A, the semiconductor die 21 and the front side components 27 are attached to the first side 48a of the carrier circuit board 23. Additionally, the RF shield 32 is also attached to the first side 48a of the carrier circuit board 23 to enclose the semiconductor die 21 and the front side components 27 in a cavity. Due to the low profile or height of the semiconductor die 21, the front side of the carrier circuit board 23 also has a low profile. In certain implementations, the front side components 27 include RF components, which can be connected to the semiconductor die 21 by way of connections through the carrier circuit board 23. Examples of the front side components 27 include other semiconductor dies, IPDs, and/or SMDs.

With continuing reference to FIG. 2A, the back side components 28 are connected to the second side of the carrier circuit board 23. In certain implementations, the back side components 28 include low frequency or DC components, which can, for example, include other semiconductor dies, connectors, and/or other components. Since the back side components 28 can be tall, the inclusion of the secondary circuit board 22 on the second side 48b of the carrier circuit board 23 can have little to no impact on a total height of the system. The inductor shielding structure 26 aids in prevent electromagnetic fields generated by the inductors 24a and 24b from reaching the back side components 28.

Figure 2B:
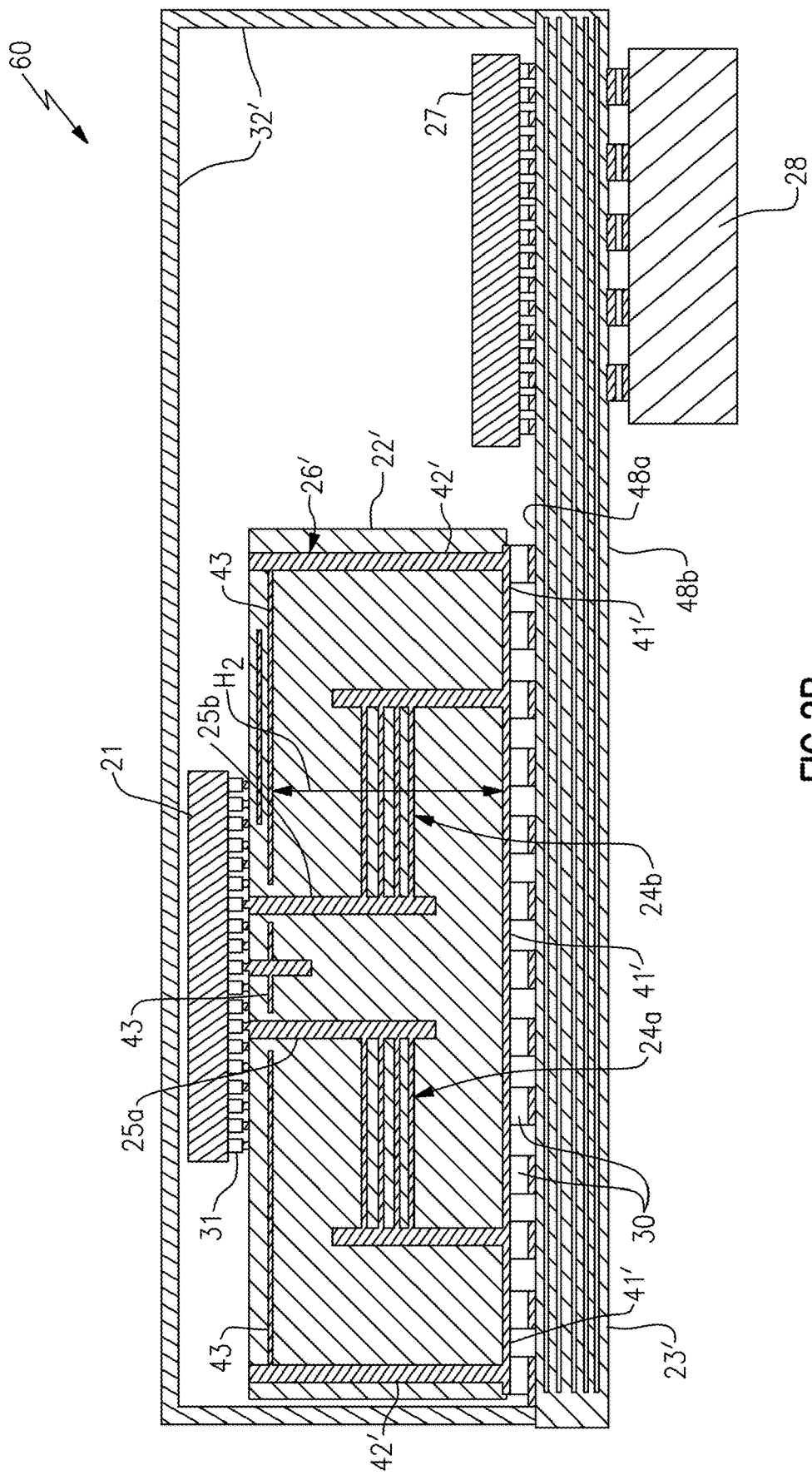
FIG. 2B is a schematic diagram of a cross-section of an RF system according to another embodiment.

FIG. 2B is a schematic diagram of a cross-section of an RF system 60 according to another embodiment. The RF system 60 includes a semiconductor die 21 (including at least one controllable capacitor thereon), a secondary circuit board 22', a carrier circuit board 23', a first multi-turn inductor 24a, a second multi-turn inductor 24b, a first metal connection 25a, a second metal connection 25b, an inductor shielding structure 26', front side components 27, back side components 28, solder balls 30, copper pillars 31, and an RF shield 32'.

In comparison to the RF system 50 of FIG. 2A, the RF system 60 of FIG. 2B includes a different arrangement of the semiconductor die 21, the secondary circuit board 22', and the carrier circuit board 23'. In particular, the semiconductor die 21 is attached to a first side of the secondary circuit board 22', and a second side of the secondary circuit board 22' is attached to the first side 48a of the carrier circuit board 23'. Additionally, the RF shield 32' is attached to the first side 48a of the carrier circuit board 23', and encloses the semiconductor die 21, the secondary circuit board 22', and the front side components 27 in a cavity.

In the illustrated embodiment, the secondary circuit board 22' includes a first multi-turn inductor 24a and a second multi-turn inductor 24b formed therein from patterned conductive layers of the secondary circuit board 22'. Although an example with two multi-turn inductors is depicted, the secondary circuit board 22' can be implemented with more or fewer inductors and/or inductors of different types.

The inductors 24a and 24b are shielded by the inductor shielding structure 26'. In comparison to the inductor shielding structure 26 of FIG. 2A, the inductor shielding structure 26' of FIG. 2B is formed entirely on the secondary circuit board 22'. As a result, a height $H_2$ of the resonant assembly of FIG. 2B is larger than the height $H_1$ of the resonant assembly of FIG. 2A.

As shown in FIG. 2B, the inductor shielding structure 26' includes a bottom ground plane 41', walls 42', and a top ground plane 43. The top ground plane 43 includes openings for passage of the electrical connections 25a and 25b between the pins of the semiconductor die 21 and the first ends of the inductors 25a and 25b. Additionally, second ends of the inductors 25a and 25b are grounded by connection to the bottom ground plane 41', in this example.

Although an example without shielding between the inductors 24a and 24b is shown, in other implementations grounded walls are included between the inductors.

Figure 3A:
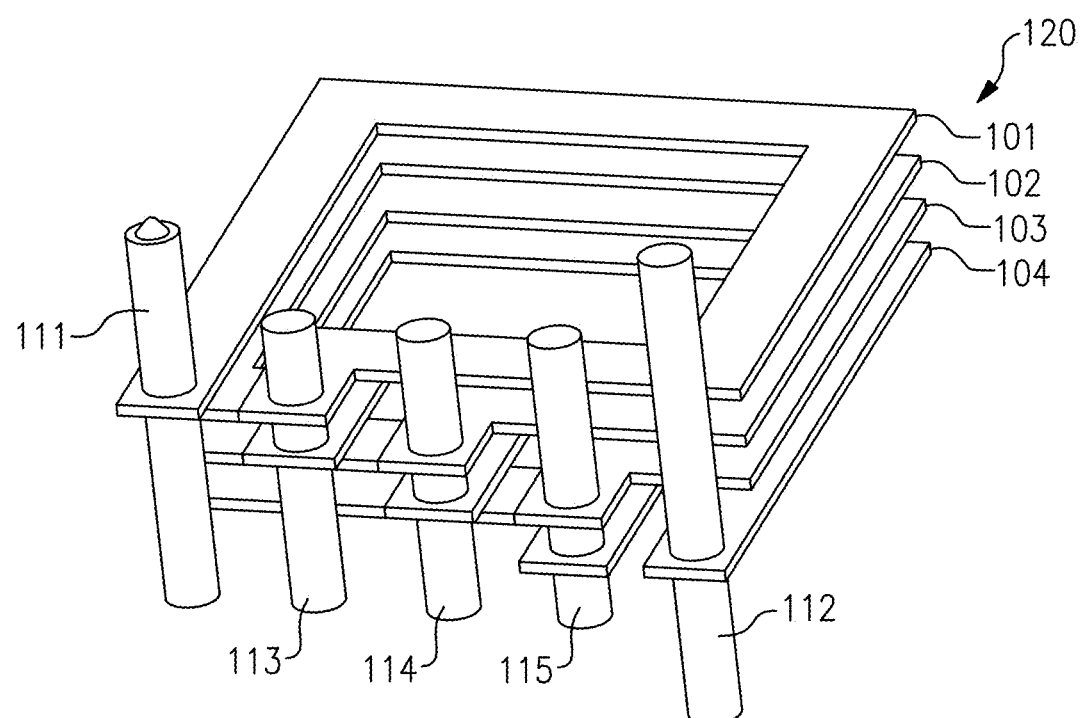
FIG. 3A is a perspective view of a multi-turn inductor according to one embodiment.

FIG. 3A is a perspective view of a multi-turn inductor 120 according to one embodiment. The multi-turn inductor 120 includes a first turn 101, a second turn 102, a third turn 103, a fourth turn 104, a first pillar 111, a second pillar 112, a third pillar 113, a fourth pillar 114, and a fifth pillar 115.

The multi-turn inductor 120 illustrates one embodiment of an inductor structure that can be formed in a secondary circuit board. However, the teachings herein are applicable to inductor structures implemented in other ways.

In the illustrated embodiment, the first turn 101 is formed in a first patterned metallization layer of the secondary circuit board, the second turn 102 is formed in a second patterned metallization layer of the secondary circuit board, the third turn 103 is formed in a third patterned metallization layer of the secondary circuit board, and the fourth turn 104 is formed in a fourth patterned metallization layer of the secondary circuit board. For clarity of the figure, dielectric between the metallization layers has not been depicted in FIG. 3A.

The first pillar 111 connects to one end of the first turn 101, and serves as a first terminal of the multi-turn inductor 120. The second pillar 112 connects to one end of the fourth turn 104, and serves as a second terminal of the multi-turn inductor 120.

The third pillar 113 connects the first turn 101 to the second turn 102. Additionally, the fourth pillar 114 connects the second turn 102 to the third turn 103, while the fifth pillar 115 connects the third turn 103 to the fourth turn 104. In certain implementations, one or more of the pillars 113, 114, or 115 serves as a terminal for tapping the multi-turn inductor 120. For example, the pillar 114 can serve as a center tap of the multi-turn inductor 120. Such taps can be connected to pins of a semiconductor die to aid in implementing tunable filter topologies utilized tapped inductors.

Figure 3B:
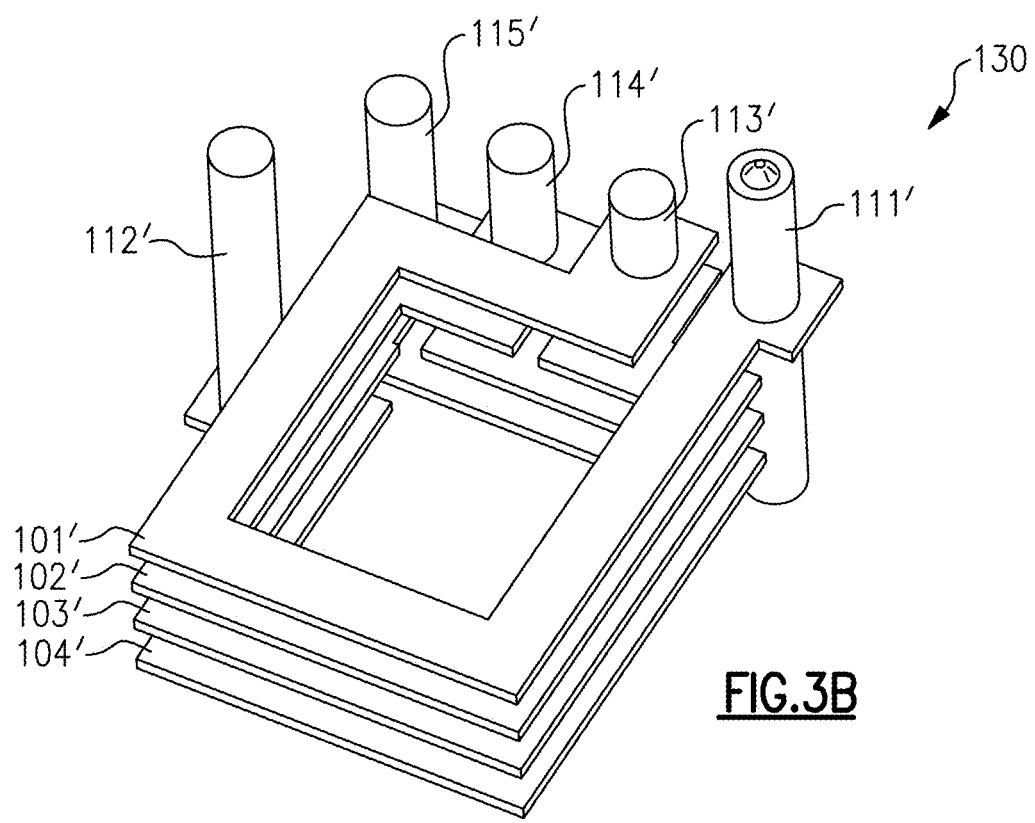
FIG. 3B is a perspective view of a multi-turn inductor according to another embodiment.

FIG. 3B is a perspective view of a multi-turn inductor 130 according to another embodiment. The multi-turn inductor 130 includes a first turn 101', a second turn 102', a third turn 103', a fourth turn 104', a first pillar 111', a second pillar 112', a third pillar 113', a fourth pillar 114', and a fifth pillar 115'.

The multi-turn inductor 130 illustrates another embodiment of an inductor structure that can be formed in a secondary circuit board. However, the teachings herein are applicable to inductor structures implemented in other ways.

The multi-turn inductor 130 of FIG. 3B is similar to the multi-turn inductor 120 of FIG. 3A, except that the multi-turn inductor 130 of FIG. 3B is implemented with tighter turns.

By adjusting the number and/or length of the turns, a desired overall inductance of a multi-turn inductor can be achieved.

Figure 4A:
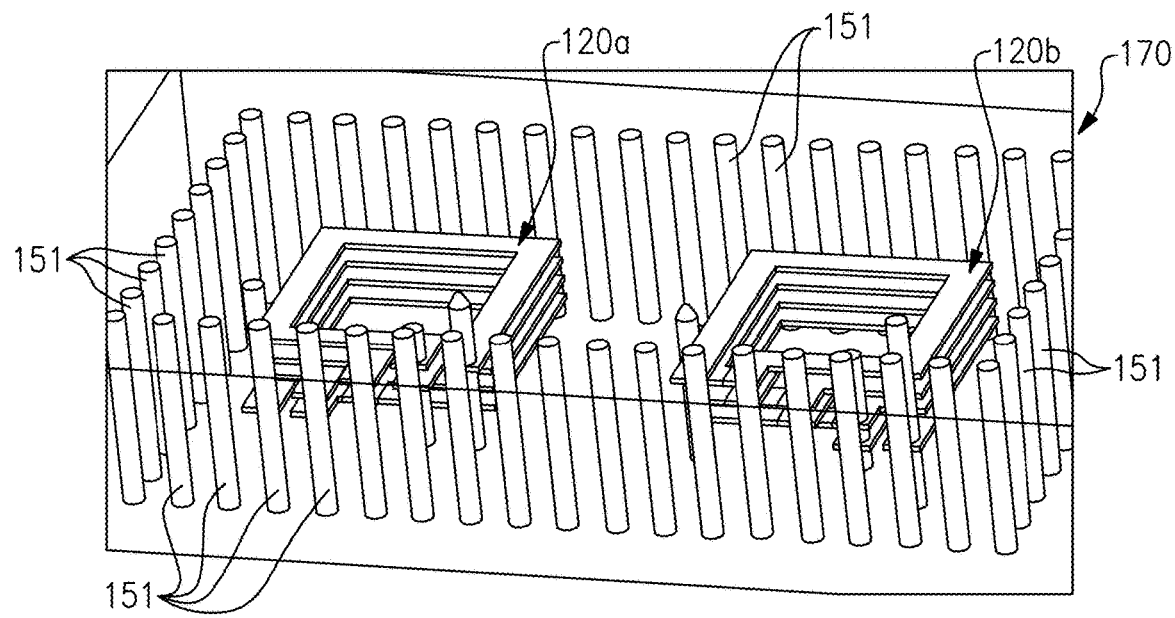
FIG. 4A is a perspective view of a pair of multi-turn inductors according to one embodiment.

FIG. 4A is a perspective view of a pair of multi-turn inductors 170 according to one embodiment. The pair of multi-turn inductors 170 includes a first multi-turn inductor 120a, a second multi-turn inductor 120b, and a plurality of pillars 151.

The pair of multi-turn inductors 170 illustrates another embodiment of an inductor structure that can be formed in a secondary circuit board. However, the teachings herein are applicable to inductor structures implemented in other ways.

In the illustrated embodiment, the first multi-turn inductor 120a and the second multi-turn inductor 120b are each implemented in accordance with the multi-turn inductor 120 of FIG. 3A.

As shown in FIG. 4A, the pillars 151 form walls that surround the sides of the pair of multi-turn inductors 170. In certain implementations, the pillars 151 are grounded.

Figure 4B:
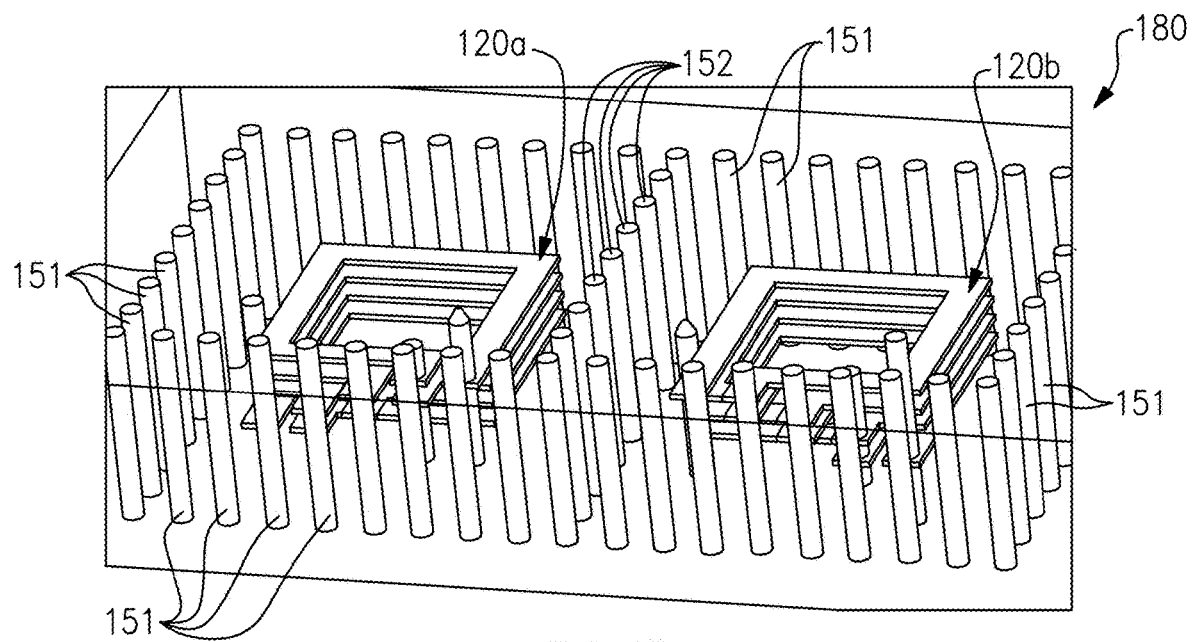
FIG. 4B is a perspective view of a pair of multi-turn inductors according to another embodiment.

FIG. 4B is a perspective view of a pair of multi-turn inductors 180 according to another embodiment. The pair of multi-turn inductors 180 includes a first multi-turn inductor 120a, a second multi-turn inductor 120b, a first plurality of pillars 151, and a second plurality of pillars 152. The plurality of pillars 152 can be increase or reduced in numbers in order to control an amount of magnetic coupling between the inductors 120a and 120b.

The pair of multi-turn inductors 180 illustrates another embodiment of an inductor structure that can be formed in a secondary circuit board. However, the teachings herein are applicable to inductor structures implemented in other ways.

The pair of multi-turn inductors 180 of FIG. 4B is similar to the pair of multi-turn inductors 170 of FIG. 4A, except that the pair of multi-turn inductors 180 further includes the pillars 152 providing shielding between the first multi-turn inductor 120a and the second multi-turn inductor 120b. In certain implementations, both the pillars 151 and the pillars 152 are grounded.

Figure 5:
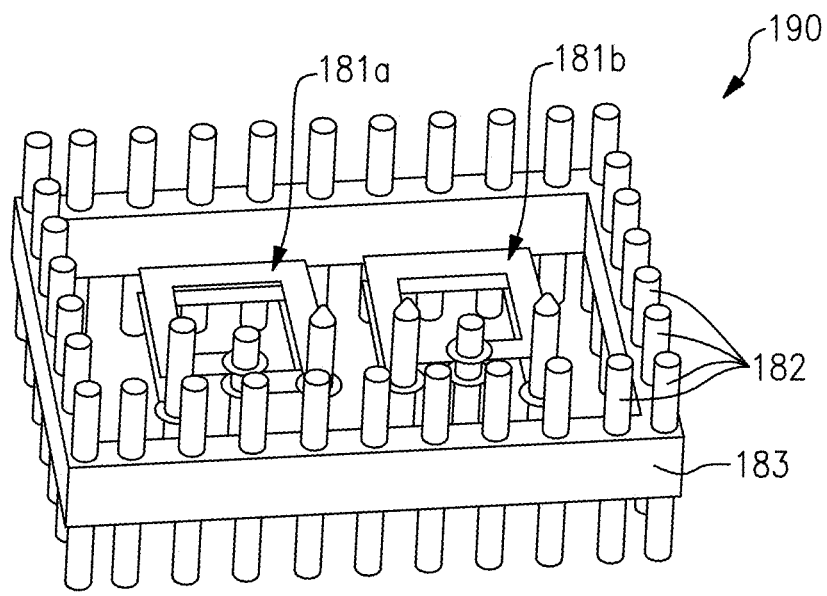
FIG. 5 is a perspective view of a pair of multi-turn inductors according to another embodiment.

FIG. 5 is a perspective view of a pair of multi-turn inductors 190 according to another embodiment. The pair of multi-turn inductors 190 includes a first multi-turn inductor 181a, a second multi-turn inductor 181b, a plurality of pillars 182, and a ring 183. Although the ring 183 is depicted as solid, the ring need not be continuous. For example, the ring 183 can formed out of the same metal layers used to for the inductors 181a and 181b.

The pair of multi-turn inductors 190 illustrates another embodiment of an inductor structure that can be formed in a secondary circuit board. However, the teachings herein are applicable to inductor structures implemented in other ways.

As shown in FIG. 5, the first multi-turn inductor 181a and the second multi-turn inductor 181b are surrounded by pillars 182, which serve as walls for shielding the sides of the inductors along an outer perimeter. Additionally, the ring 183 is incorporated into the walls to further enhance shielding. In certain implementations, the pillars 182 and the ring 183 are grounded.

Figure 6:
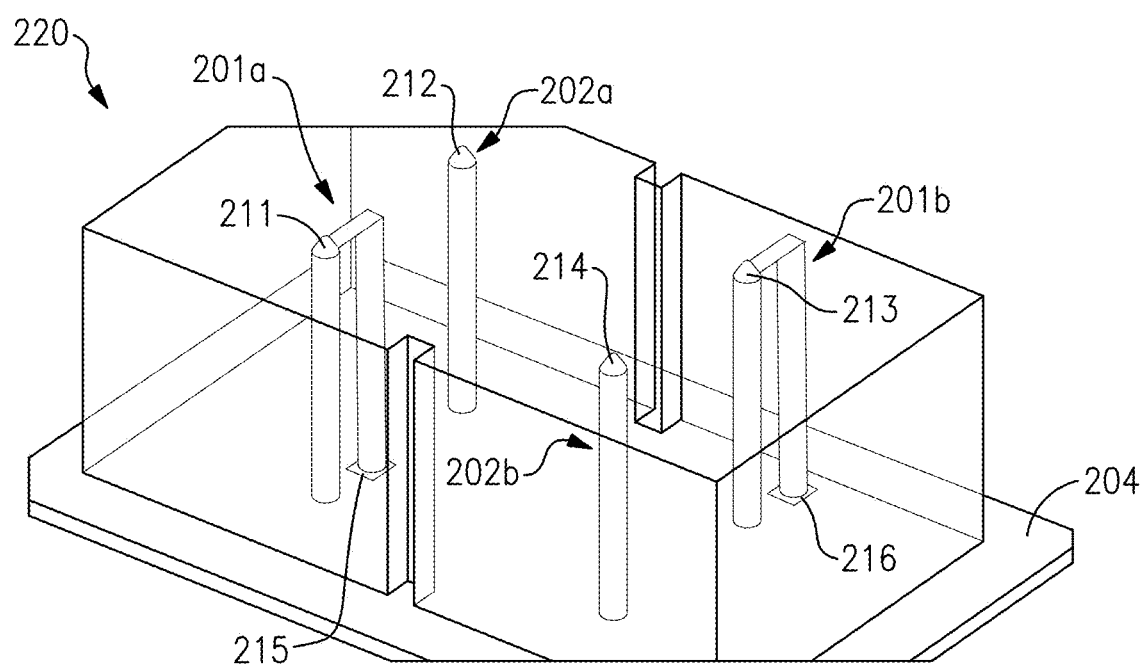
FIG. 6 is a perspective view of a comb-type inductor structure according to one embodiment.

FIG. 6 is a perspective view of a comb-type inductor structure 220 according to one embodiment. The comb-type inductor structure 220 includes a first comb-type inductor 201a, a second comb-type inductor 201b, a third comb-type inductor 202a, a fourth comb-type inductor 202b, and a ground plane 204. Although only a bottom portion of the ground plane 204 is shown in FIG. 6, the ground plane 204 can also surround the inductors on all four side walls and/or above the inductors.

The comb-type inductor structure 220 illustrates another embodiment of an inductor structure that can be formed in a secondary circuit board. However, the teachings herein are applicable to inductor structures implemented in other ways.

As shown in FIG. 6, a first terminal 211, a second terminal 212, a third terminal 213, a fourth terminal 214, a fifth terminal 215, and a sixth terminal 216 are depicted. In certain implementations, each of the first terminal 211, the second terminal 212, the third terminal 213, and the fourth terminal 214 are connected to controllable capacitors formed on a semiconductor die, thereby forming a resonant structure. In certain implementations, the fifth terminal 215 and the sixth terminal 216 serve as input/output terminals.

Figure 7A:
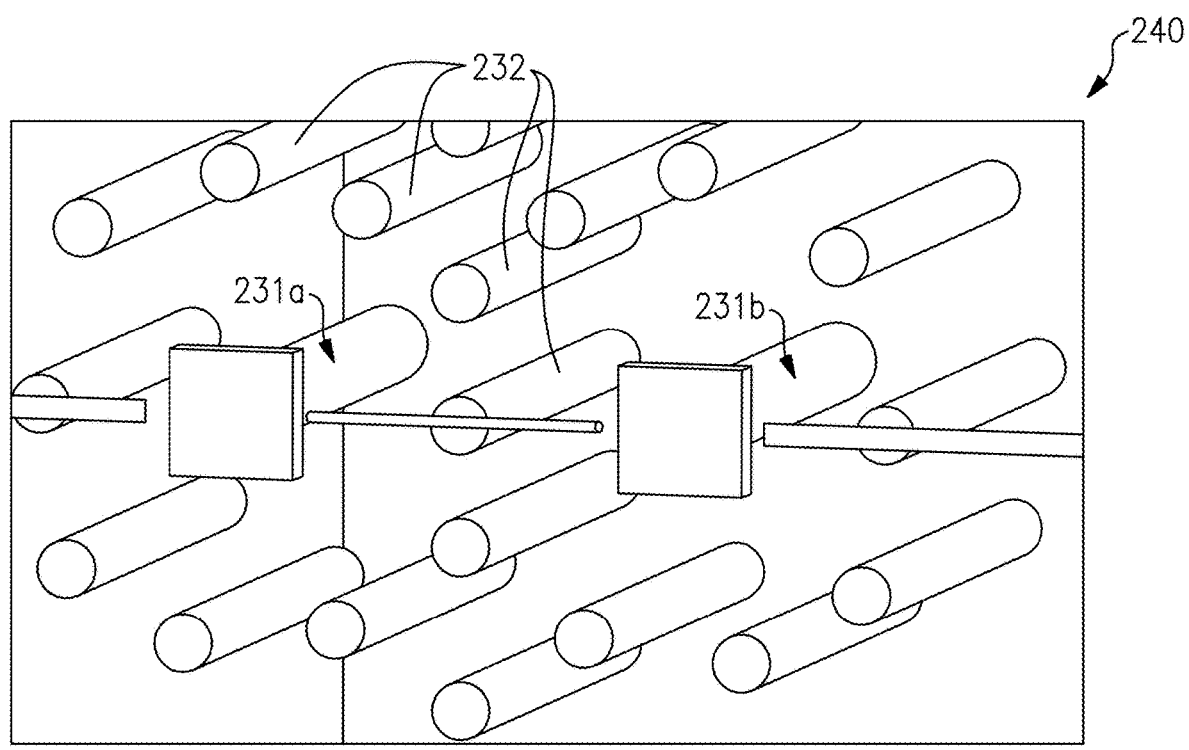
FIG. 7A is a perspective view of another embodiment of a pair of comb-type inductors with a top ground plane omitted.
Figure 7B:
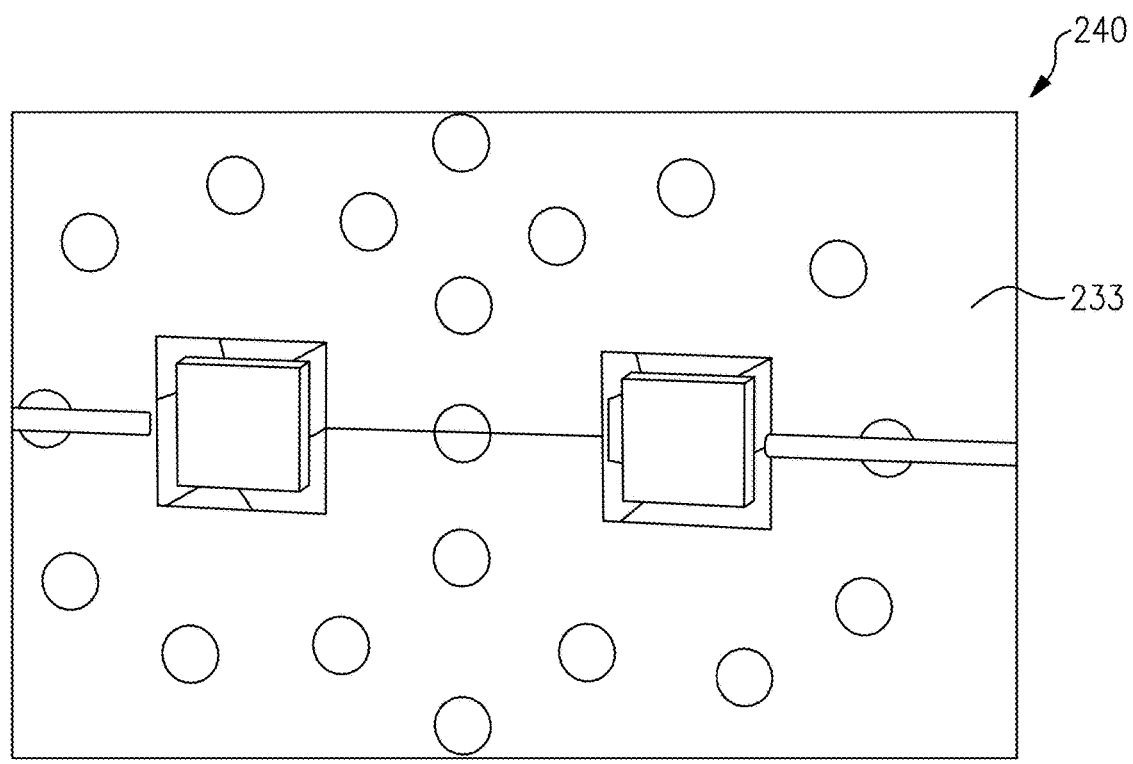
FIG. 7B is a perspective view of the pair of comb-type inductors of FIG. 7A with the top ground plane included.

FIG. 7A is a perspective view of another embodiment of a pair of comb-type inductors 240 with a top ground plane 233 omitted. FIG. 7B is a perspective view of the pair of comb-type inductors 240 of FIG. 7A with the top ground plane 233 included.

The pair of comb-type inductors 240 includes a first comb-type inductor 231a, a second comb-type inductor 231b, and pillars 232 that surround each comb-type inductor, thereby serving as walls both around and between the comb-type inductors 231a and 231b.

Figure 8A:
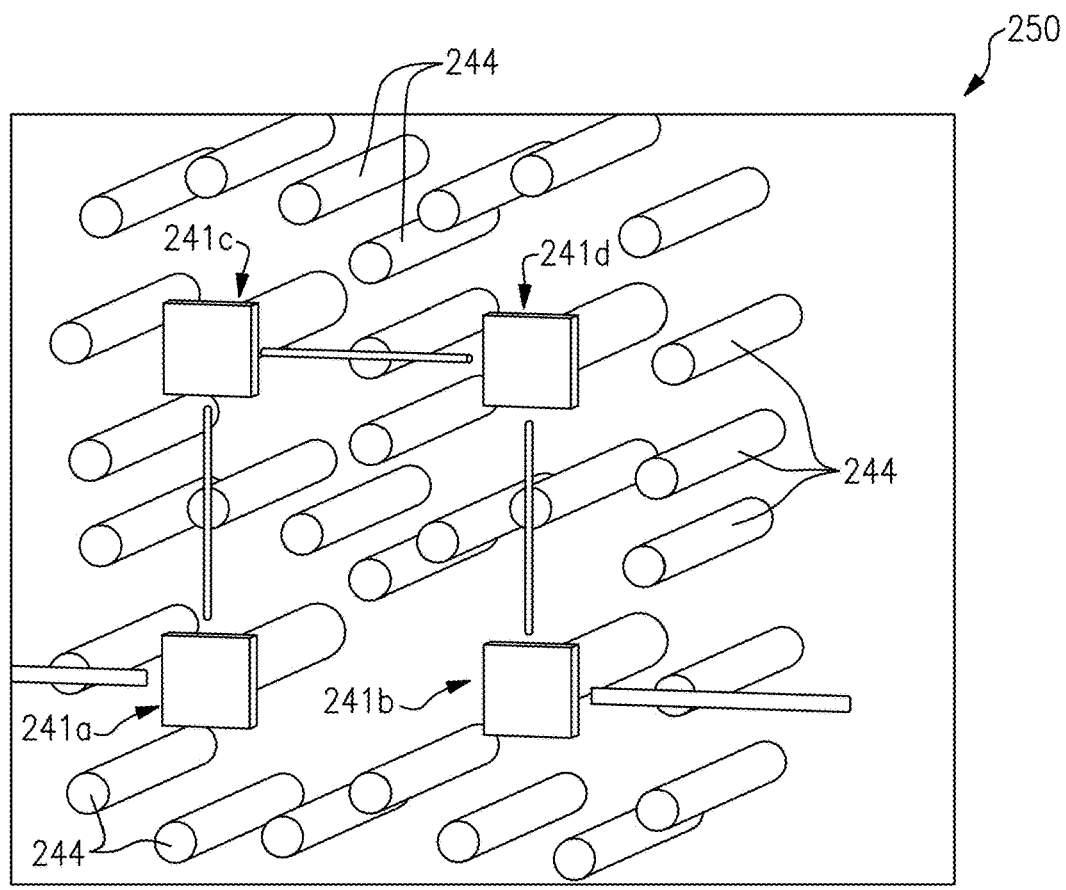
FIG. 8A is a perspective view of a cross-coupled inductor structure according to one embodiment.

FIG. 8A is a perspective view of a cross-coupled inductor structure 250 according to one embodiment. The cross-coupled inductor structure 250 includes a first comb-type inductor 241a, a second comb-type inductor 241b, a third comb-type inductor 241c, a fourth comb-type inductor 241d, and pillars 244. For clarity of the figure, ground planes above and below the structure have been omitted from the drawing.

The cross-coupled inductor structure 250 illustrates another embodiment of an inductor structure that can be formed in a secondary circuit board. However, the teachings herein are applicable to inductor structures implemented in other ways.

As shown in FIG. 8A, the first comb-type inductor 241a is cross-coupled to the second comb-type inductor 241b due to omission of the pillars 244 between these inductors. The pillars 244 serve as walls that otherwise shield the inductors from one another and from external components. By controlling a number and position of the pillars 244 between the comb-type inductors, desired cross-coupling can be achieved.

By providing cross-coupling, a bandstop feature can be provided. For example, such a bandstop feature can be magnetic from a first resonator to a last resonator through adjustment of ground vias or pillars. Although cross-coupling with comb-type inductors is depicted, other types of inductors can be cross-coupled.

Figure 8B:
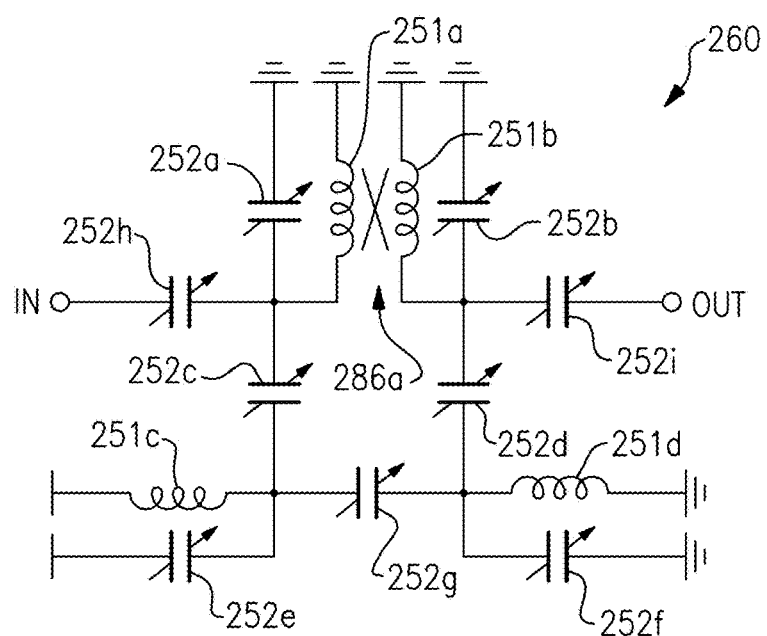
FIG. 8B is a schematic diagram of one embodiment of a cross-coupled filter incorporating the cross-coupled inductors of FIG. 8A.

FIG. 8B is a schematic diagram of one embodiment of a cross-coupled filter 260 incorporating the cross-coupled inductor structure 250 of FIG. 8A. The cross-coupled filter 260 includes a first inductor 251a, a second inductor 251b, a third inductor 251c, and a fourth inductor 251d, which can be implemented using the cross-coupled inductor structure 250 of FIG. 8A. The cross-coupled filter 250 further includes a first capacitor 252a, a second capacitor 252b, a third capacitor 252c, a fourth capacitor 252d, a fifth capacitor 252e, a sixth capacitor 252f, a seventh capacitor 252g, an eight capacitor 252h, and a ninth capacitor 252i, any or all of which can be controllable.

Figure 8C:
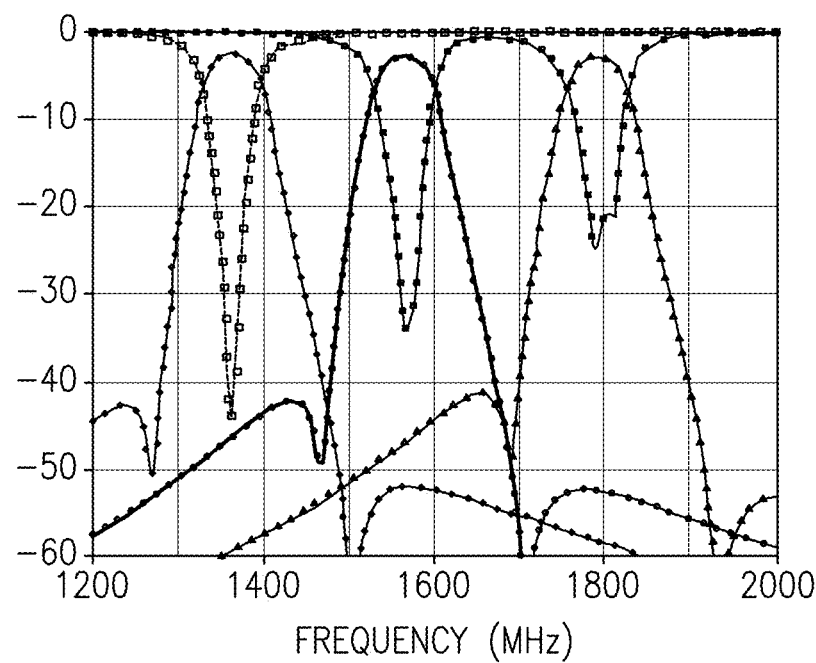
FIG. 8C is one example of a graph of gain versus frequency for the cross-coupled filter of FIG. 8B.

FIG. 8C is one example of a graph of gain versus frequency for the cross-coupled filter 260 of FIG. 8B. The plot depicts example performance with constant 3 dB bandwidth and the cross-coupling providing a bandstop response.

Figure 9A:
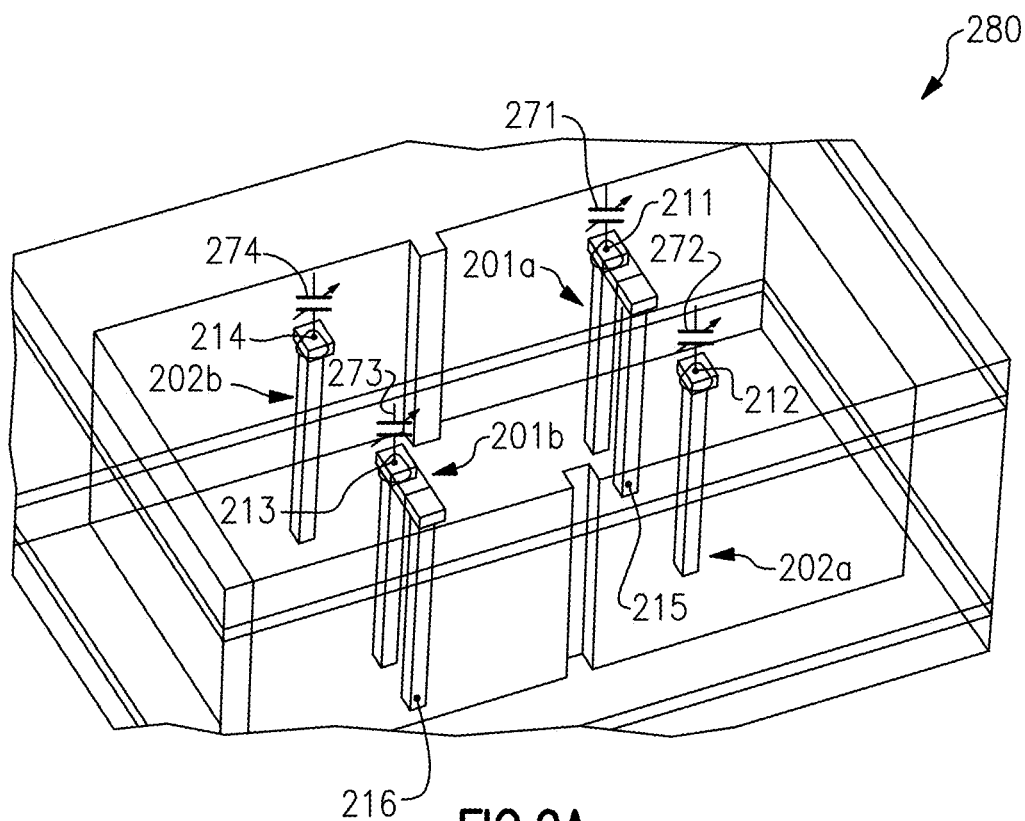
FIG. 9A is a perspective view of one embodiment of a dual-mode filter according to one embodiment.

FIG. 9A is a perspective view of one embodiment of a dual-mode filter 280 according to one embodiment. The dual-mode filter 280 of FIG. 9A is similar to the comb-type inductor structure 220 of FIG. 6, except that the dual-mode filter 280 further includes a first controllable capacitor 271, a second controllable capacitor 272, a third controllable capacitor 273, and a fourth controllable capacitor 274 connected as shown. The depicted controllable capacitors are formed on a semiconductor die (now shown in FIG. 9A).

Figure 9B:
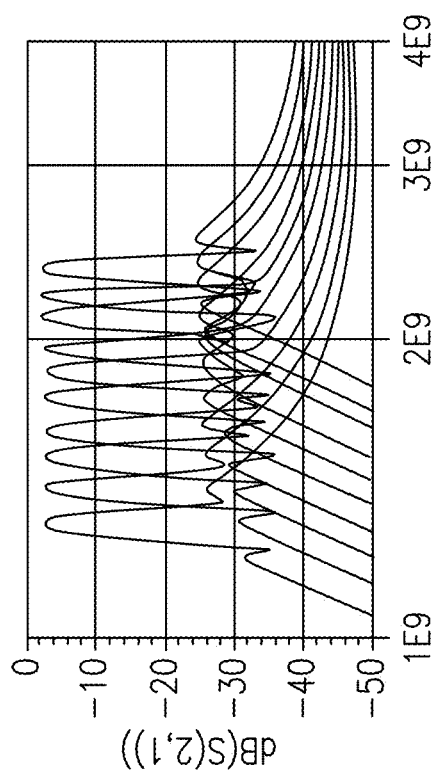
FIG. 9B is one example of a graph of gain versus frequency for the dual-mode filter of FIG. 9A.

FIG. 9B is one example of a graph of gain versus frequency for the dual-mode filter 280 of FIG. 9A.

With reference to FIGS. 9A and 9B, the illustrated example utilizes complex resonators with more than one resonance mode. The added resonance modes allow for adjustable bandstop responses (for instance, notches). Such adjustable notches also allow sharper bandpass responses without significant impact on bandpass insertion loss. In certain implementations, the resonance modes includes at least one differential or odd-mode resonance and at least one common or even-mode resonance.

Figure 10A:
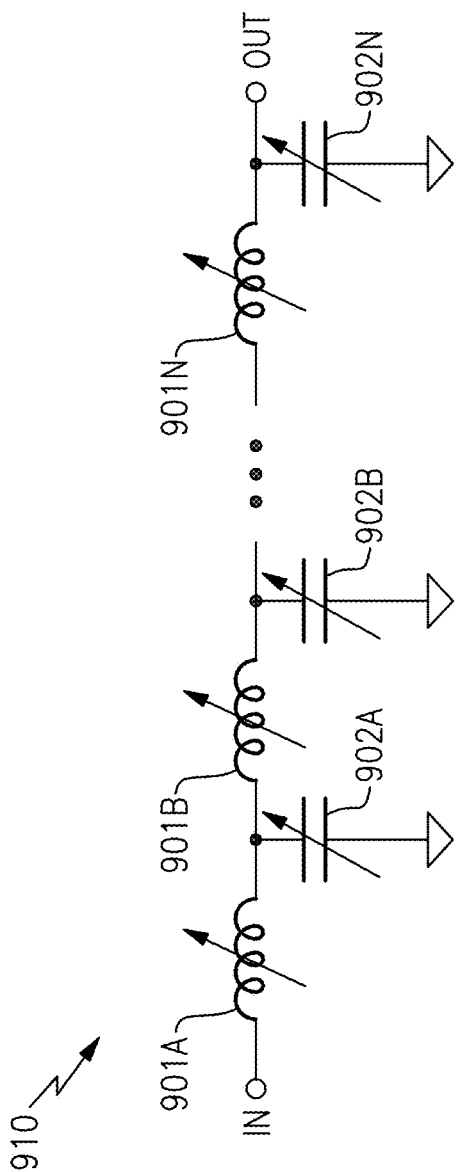
FIG. 10A is a schematic diagram of a tunable filter according to one embodiment.

FIG. 10A is a schematic diagram of a tunable filter 910 according to one embodiment. The tunable filter 210 includes series inductors 901A, 901B, . . . 901N and shunt capacitors 902A, 902B, . . . 902N electrically connected between an input terminal (IN) and an output terminal (OUT) as depicted. Any number of inductors and/or capacitors can be included and any combination of the components can be controllable.

A control circuit (not shown in FIG. 10A) can adjust the component values of controllable components to achieve tuning.

Figure 10B:
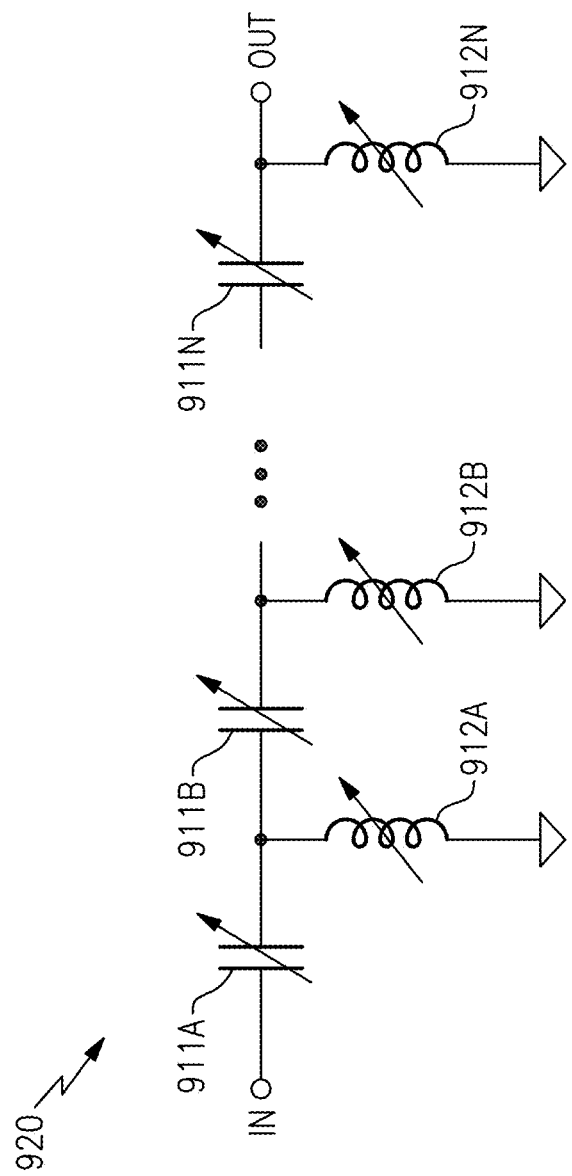
FIG. 10B is a schematic diagram of a tunable filter according to another embodiment.

FIG. 10B is a schematic diagram of a tunable filter 920 according to another embodiment. The tunable filter 920 includes series capacitors 911A, 911B, . . . 911N and shunt inductors 912A, 912B, . . . 912N electrically connected between an input (IN) and an output (OUT) as depicted. Any number of inductors and/or capacitors can be included and any combination of the components can be controllable.

A control circuit (not shown in FIG. 10B) can adjust the component values of controllable components to achieve tuning.

In one embodiment, the tunable filter 920 of FIG. 10B is arranged in cascade with the tunable filter 910 of FIG. 10A (in either order or sequence) to provide a tunable bandpass filter.

In certain implementations, a tunable filter, such as the tunable filter 910 of FIG. 10A or the tunable filter 920 of FIG. 10B, is implemented with low impedance for increased linearity performance in the presence of AC voltage swings.

Figure 11:
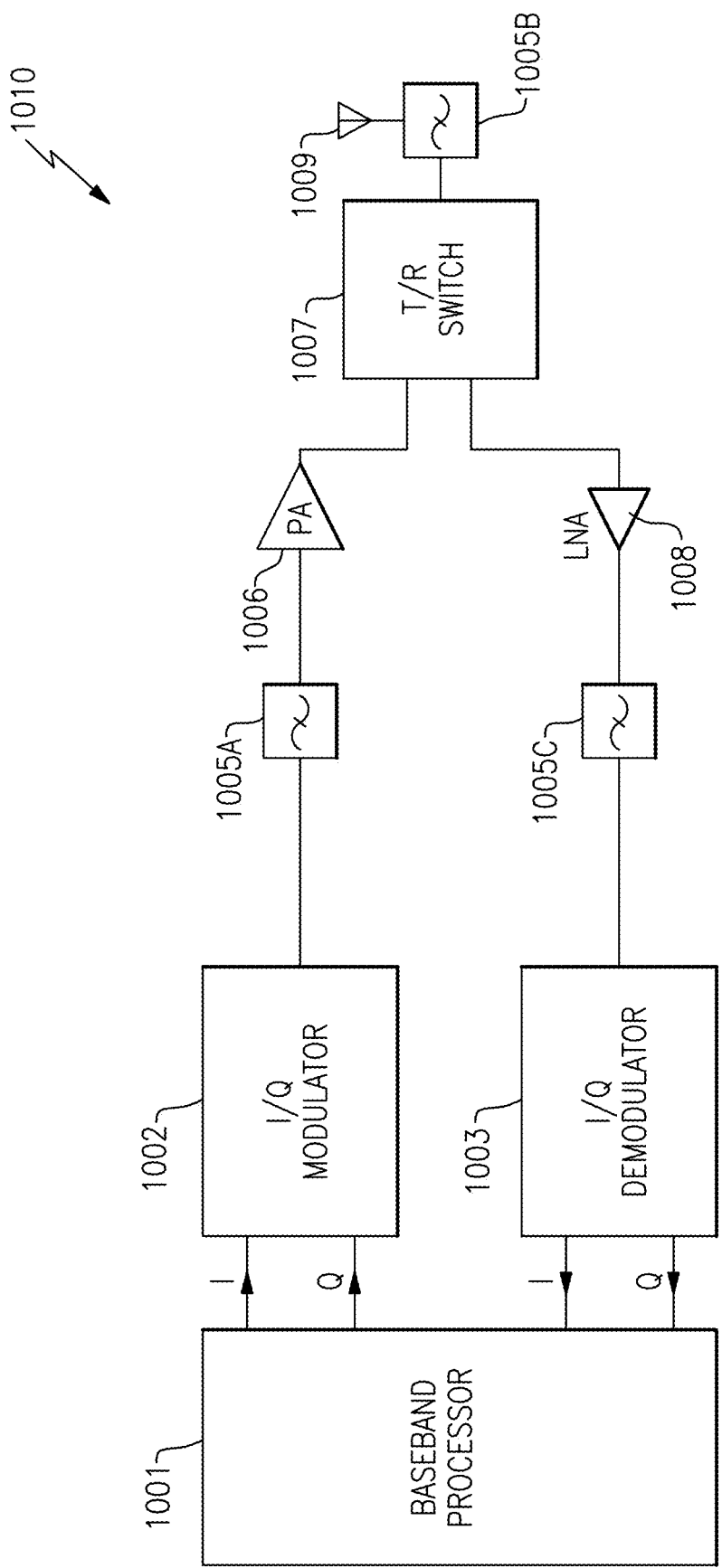
FIG. 11 is a schematic diagram of one example of an RF communication system that can include one or more tunable filters in accordance with the teachings herein.

FIG. 11 is a schematic diagram of one example of an RF communication system 1010 that can include one or more tunable filters in accordance with the teachings herein.

Although the RF communication system 1010 illustrates one example of an electronic system that can include one or more tunable filters described herein, tunable filters can also be used in other configurations of electronic systems.

Furthermore, although a particular configuration of components is illustrated in FIG. 11, the RF communication system 1010 can be adapted and modified in a wide variety of ways. For example, the RF communication system 1010 can include more or fewer receive paths and/or transmit paths. Additionally, the RF communication system 1010 can be modified to include more or fewer components and/or a different arrangement of components, including, for example, a different arrangement of RF switching circuits, amplifiers, and/or filters.

In the illustrated configuration, the RF communication system 1010 includes a baseband processor 1001, an I/Q modulator 1002, an I/Q demodulator 1003, a first tunable filter 1005A, a power amplifier 1006, a transmit/receive (T/R) switch 1007, a low noise amplifier (LNA) 1008, an antenna 1009, a second tunable filter 1005B, and a third tunable filter 1005C. Although the first to third tunable filters 1005A-1005C are examples uses of tunable filters, other placements of tunable filter(s) in transmit and/or receive paths of the RF communication system 1010 are possible.

As shown in FIG. 11, baseband processor 1001 generates an in-phase (I) transmit signal and a quadrature-phase (Q) transmit signal, which are provided to the I/Q modulator 1002. Additionally, the baseband processor 1001 receives an I receive signal and a Q receive signal from the I/Q demodulator 1003. The I and Q transmit signals correspond to signal components of a transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1001 can include a digital signal processor, a microprocessor, or a combination thereof, used for processing the digital signals.

The I/Q modulator 1002 receives the I and Q transmit signals from the baseband processor 1001 and processes them to generate a modulated RF signal. In certain configurations, the I/Q modulator 1002 can include DACs configured to convert the I and Q transmit signals into an analog format, mixers for upconverting the I and Q transmit signals to radio frequency, and a signal combiner for combining the upconverted I and Q signals into the modulated RF signal.

The first tunable filter 1005A receives the modulated RF signal from the I/Q modulator 1002, and provides a filtered RF signal to an input of the power amplifier 1006. In certain configurations, the first tunable filter 1005A can implement a band pass filter configured to provide band filtering, with the lower and upper cutoff frequencies of the band pass being tunable based on an input control signal received by the first tunable filter 1005A. In some implementations, the first tunable filter 1005A can also be configured to implement a low-pass filter, a band pass filter, a notch filter, a high-pass filter, or a combination thereof, based on the input control signal. Thus, the particular set of frequencies filtered by the first tunable filter 1005A can be adjusted using the input control signal applied to the first tunable filter 1005A.

The power amplifier 1006 can amplify the filtered RF signal to generate an amplified RF signal, which is provided to the transmit/receive switch 1007. The transmit/receive switch 1007 is further electrically connected to the second tunable filter 1005B and to an input of the low noise amplifier 1008. The second tunable filter 1005B is connected to the antenna 1009. Thus, in this example, the power amplifier 1006 provides the amplified RF signal to the antenna 1009 by way of the transmit/receive switch 1007 and the second tunable filter 1005B. However, other implementations are possible, such as configurations in which the second tunable filter 1005B is omitted.

In certain configurations, the second tunable filter 1005B can be configured to operate similarly to the first tunable filter 1005A, for example, by selectively implementing a band pass filter, a low-pass filter, a notch filter, a high-pass filter, or a combination thereof, based on an control input signal received at the second tunable filter 1005B. Thus, the particular set of frequencies filtered by the second tunable filter 1005B can be adjusted using the input control signal applied to the second tunable filter 1005B.

The transmit/receive switch 1007 can be used to selectively connect the antenna 1009 (via the second tunable filter 1005B) to the output of the power amplifier 1006 or to the input of the low noise amplifier 1008. In certain implementations, the transmit/receive switch 1007 can provide a number of other functionalities, including, but not limited to, band switching and/or switching between different power modes.

The LNA 1008 receives an antenna receive signal from the transmit/receive switch 1007, and generates an amplified antenna receive signal that is provided to the third tunable filter 1005C, which is configured to filter the receive signal and provide the filtered receive signal to the I/Q demodulator 1003.

In certain configurations, the third tunable filter 1005C can be configured to operate similarly to the first tunable filter 1005A, for example, by selectively implementing a band pass filter, a low-pass filter, a notch filter, a high-pass filter, or a combination thereof, based on an input signal received at the third tunable filter 1005C.

The I/Q demodulator 1003 can be used to generate the I receive signal and the Q receive signal, as was descried above. In certain configurations, the I/Q demodulator 1003 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

Figure 12:
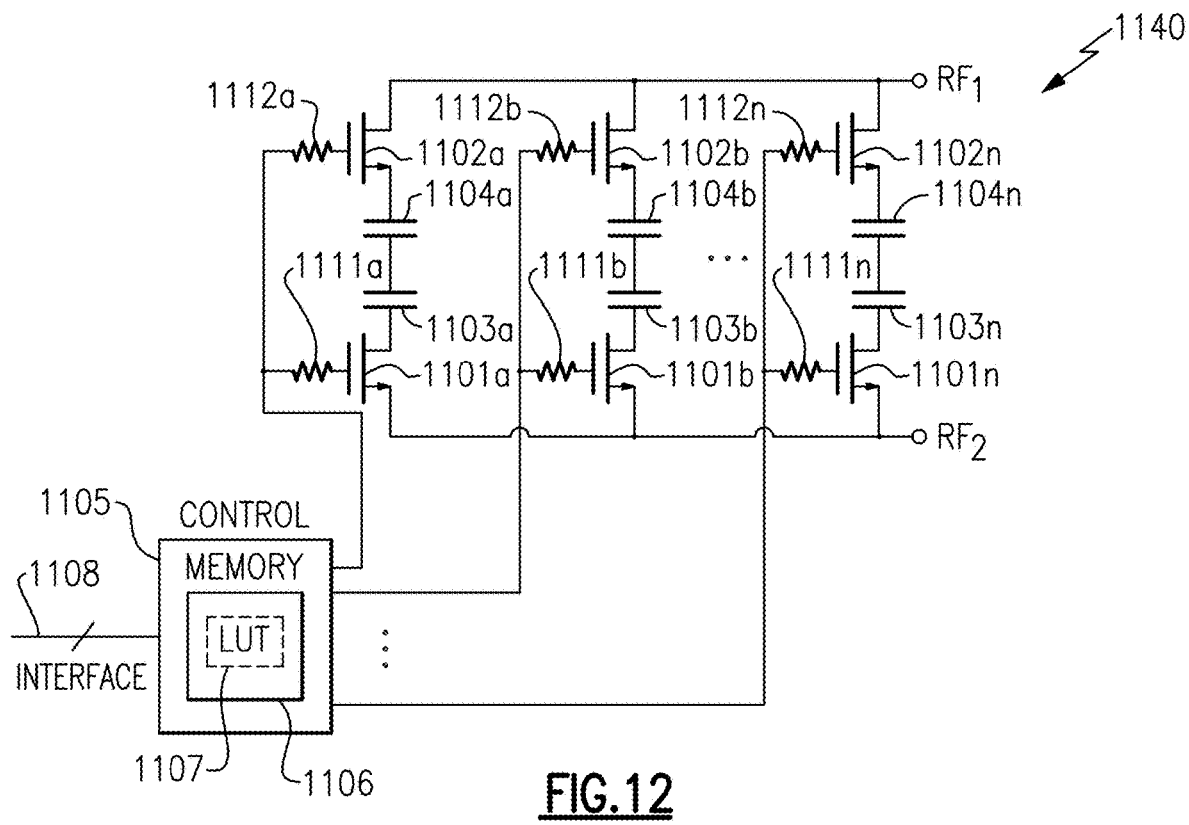
FIG. 12 is a schematic diagram of a controllable capacitor according to one embodiment.

FIG. 12 is a schematic diagram of a controllable capacitor 1140 according to one embodiment. The controllable capacitor 1140 includes a first group of field-effect transistors (FETs) 1101a, 1101b, . . . 1101n, a second group of FETs 1102a, 1102b, . . . 1102n, a first group of capacitors 1103a, 1103b, . . . 1103n, a second group of capacitors 1104a, 1104b, . . . 1104n, a control circuit 1105, a first group of gate resistors 1111a, 1111b, . . . 1111n, and a second group of gate resistors 1112a, 1112b, . . . 1112n.

The controllable capacitor 1140 illustrates one embodiment of a controllable capacitor that can be included on a semiconductor die and used in a tunable filter. However, the teachings herein are applicable to other implementations of controllable capacitors. Furthermore, although one controllable capacitor is depicted, multiple controllable capacitors can be included on a semiconductor die.

Implementing controllable capacitors on a semiconductor die provides a number of advantages, such as low equivalent series resistance (ESR), small size, low cost, and/or low reactance.

In the illustrated embodiment, the controllable circuit 1140 is implemented using multiple circuit branches in parallel between a first RF terminal $RF_1$ and a second RF terminal $RF_2$, which in certain implementations are connected to pins of a semiconductor die. Additionally, each circuit branch includes a series combination of a pair of FETs and a pair of capacitors, in this embodiment. For example, the leftmost branch of FIG. 12 includes the series combination of the FET 1101a, the capacitor 1103a, the capacitor 1104a, and the FET 1102a.

In certain implementations, a controllable capacitor is implemented with multi-finger array feeds (for instance, feeds to terminals $RF_1$ and/or $RF_2$ and/or feeds to individual branches) to aid in providing low reactance capacitors with low ESR.

As shown in FIG. 12, the control circuit 1105 selective activates any desired number of branches based on data received from an interface 1108, which corresponds to any interface of a semiconductor die including, but not limited to, a serial interface or bus. By activating a desired number of branches, the amount of capacitance present between the first RF terminal $RF_1$ and the second RF terminal $RF_2$ is controlled.

The control circuit 1105 selects a particular branch by opening or closing the FETs in that branch. As shown in FIG. 12, the control circuit provides a control signal to each branch through gate resistors, which provide isolation. Although an example with two FETs per branch is shown, more or fewer FETs can be included to achieve a desired power handling capability. The FETs can be implemented in a wide variety of ways, including, but not limited to, metal-oxide-semiconductor FETs (MOSFETs), such as those fabricated using a silicon-on-insulator (SOI) process.

In certain implementations, a shared control circuit is used when multiple controllable capacitors are present. Additionally, the control circuit can control the multiple controllable capacitors using either individual control or using ganged (common) tuning.

In the illustrated embodiment, each branch includes a pair of capacitors. By including multiple capacitors in series, enhanced linearity and/or smaller capacitive step size can be achieved relative to an implementation with a single capacitor in each branch. Although an example with two capacitors per branch is shown, more or fewer capacitors can be included. The capacitors can be implemented in a wide variety of ways including, but not limited to, metal-insulator-metal (MIM) capacitors.

The FETs and capacitors in each branch can have any desired size. In certain implementations, the capacitors in each branch are weighted according to a desired weighting scheme. By weighting the capacitors, wider capacitive tuning range can be achieved relative to an implementation with fixed weights for each branch. The transistor sizes can be weighted or unweighted, based on implementation.

In the illustrated embodiment, the control circuit 1105 includes a memory 1106 storing a look-up table (LUT) 1107. The memory 1106 can be used to store capacitive settings of the controllable capacitor 1140, thereby allowing fast switching between filter states. For example, the LUT 1107 can be used to map capacitive settings (for instance, which combination of branches to select) versus desired input frequency. In certain implementations, the interface 1108 is used to write the memory 1105 and/or for a user to instruct a desired center frequency range and/or bandwidth for the tunable filter.

Figure 13:
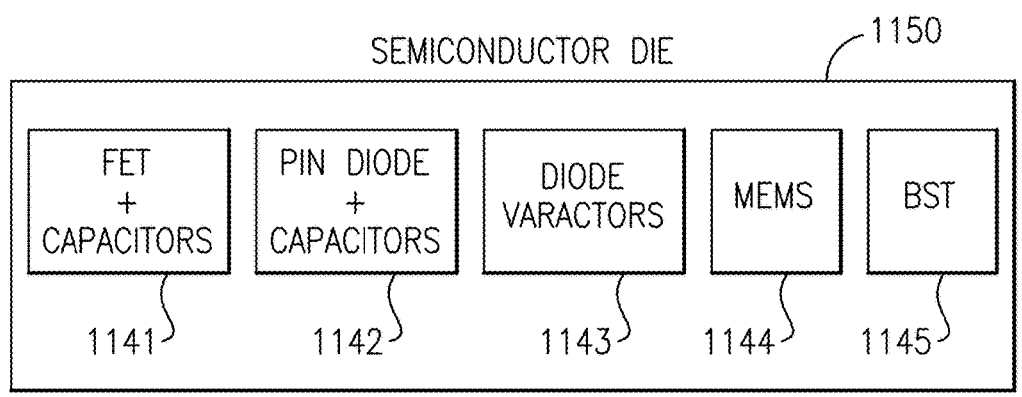
FIG. 13 is a schematic diagram of a semiconductor die according to one embodiment.

FIG. 13 is a schematic diagram of a semiconductor die 1150 according to one embodiment. The semiconductor die 1150 includes various controllable capacitors, including a FET and capacitor bank 1141 (which can be implemented, for example, using the configuration of FIG. 12), a PIN diode and capacitor bank 1142, diode varactors 1143, micro-electromechanical systems (MEMS) capacitors 1144, and barium strontium titanate (BST) capacitors 1145.

Although five examples of controllable capacitors are shown, the teachings herein are applicable to a wide variety of controllable capacitors. In particular, any suitable controllable capacitor can be used in accordance with the tunable filters herein.

Applications

Devices employing the above described schemes can be implemented into various electronic devices. Examples of electronic devices include, but are not limited to, RF communication systems, consumer electronic products, electronic test equipment, communication infrastructure, etc. For instance, tunable filters can be used in a wide range of RF communication systems, including, but not limited to, base stations, mobile devices, instrumentation, industrial electronics, military electronics, laptop computers, tablets, professional wideband digital radios, and compact and/or portable instruments. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) system with tunable filtering, the RF system comprising:
    a semiconductor die including a first controllable capacitor formed thereon; and
    a first circuit board configured to attach to a second circuit board, wherein the first circuit board includes a first inductor structure formed therein from metallization of the first circuit board, the first inductor structure configured to resonate with the first controllable capacitor to provide a tunable filter, wherein the first inductor structure is shielded from the semiconductor die by an inductor shielding structure formed at least in part from the metallization of the first circuit board.

2. The RF system of claim 1, wherein every side of the first inductor structure is shielded by the inductor shielding structure.

3. The RF system of claim 1, further comprising the second circuit board.

4. The RF system of claim 3, wherein a first portion of the inductor shielding structure is formed on the first circuit board, and a second portion of the inductor shielding structure is formed on the second circuit board.

5. The RF system of claim 3, wherein the semiconductor die is attached to a first side of the second circuit board, and the first circuit board is attached to a second side of the second circuit board opposite the first side.

6. The RF system of claim 5, further comprising an RF shield on the first side of the second circuit board and enclosing the semiconductor die in a cavity.

7. The RF system of claim 3, wherein the semiconductor die is attached to a first side of the first circuit board, and the second circuit board is attached to a second side of first circuit board opposite the first side.

8. The RF system of claim 1, wherein the semiconductor die further includes a second controllable capacitor, and the first circuit board further includes a second inductor structure formed therein from the metallization of the first circuit board, wherein the second controllable capacitor and the second inductor structure operate in the tunable filter.

9. The RF system of claim 8, wherein the inductor shielding structure includes a portion interposed between the first inductor structure and the second inductor structure.

10. The RF system of claim 8, wherein the first inductor structure and the second inductor structure are electromagnetically coupled within the inductor shielding structure, and wherein the tunable filter corresponds to a dual-mode filter or a coupled-filter.

11. The RF system of claim 1, wherein the first inductor structure corresponds to a multi-turn inductor or a comb-type inductor.

12. The RF system of claim 1, wherein the first controllable capacitor includes a plurality of selectable circuit branches in parallel with one another between a first RF terminal and a second RF terminal, wherein each of the plurality of selectable circuit branches includes a series combination of at least one field-effect transistor (FET) and at least one capacitor.

13. The RF system of claim 1, wherein the semiconductor die further includes a control circuit including a memory coupled to a serial interface and configured to store a table of settings of the first controllable capacitor.

14. The RF system of claim 1, wherein the first inductor structure includes at least one terminal connected to a pin of the semiconductor die, and at least one terminal connected to the inductor shielding structure.

15. The RF system of claim 1, wherein the first circuit board corresponds to a multi-layer printed circuit board (PCB) formed using a single lamination step.

16. A method of tunable filtering, the method comprising:
    controlling a capacitance of a controllable capacitor formed on a semiconductor die;
    resonating the controllable capacitor with an inductor structure formed in a first circuit board from metallization of the first circuit board, wherein the first circuit board is attached to a second circuit board; and
    shielding the inductor structure from the semiconductor die using an inductor shielding structure formed at least in part from the metallization of the first circuit board.

17. The method of claim 16, wherein shielding the inductor structure comprises shielding every side of the inductor structure with the inductor shielding structure.

18. The method of claim 16, wherein shielding the inductor structure comprises shielding the inductor structure using a first portion of the inductor shielding structure formed on the first circuit board, and using a second portion of the inductor shielding structure formed on the second circuit board.

19. A tunable filter comprising:

a controllable capacitor formed on a semiconductor die;

an inductor structure formed in a first circuit board from metallization of the first circuit board, the first circuit board configured to attach to a second circuit board, wherein the inductor structure resonates with the controllable capacitor; and an inductor shielding structure formed at least in part from the metallization of the first circuit board and enclosing the inductor structure.

20. The tunable filter of claim 19, further comprising the second circuit board, wherein a first portion of the inductor shielding structure is formed on the first circuit board, and a second portion of the inductor shielding structure is formed on the second circuit board.

* * * * *

UNITED STATES PATENT AND TRADEMARK OFFICE
CERTIFICATE OF CORRECTION

| | |
|---|---|
| PATENT NO. | : 11,201,602 B1 |
| APPLICATION NO. | : 16/948411 |
| DATED | : December 14, 2021 |
| INVENTOR(S) | : Ekrem Oran et al. |

It is certified that error appears in the above-identified patent and that said Letters Patent is hereby corrected as shown below:

On the Title Page

Item (72), Inventors at Lines 1-2, Change "Faith Kocer," to --Fatih Kocer,--.

Signed and Sealed this
Seventeenth Day of May, 2022

Katherine Kelly Vidal
*Director of the United States Patent and Trademark Office*